(12) United States Patent
Ogawa

(10) Patent No.: US 7,794,615 B2
(45) Date of Patent: Sep. 14, 2010

(54) PLASMA PROCESSING METHOD AND APPARATUS, AND AUTORUNNING PROGRAM FOR VARIABLE MATCHING UNIT

(75) Inventor: Hiroshi Ogawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 87 days.

(21) Appl. No.: 11/392,746

(22) Filed: Mar. 30, 2006

(65) Prior Publication Data

US 2006/0220574 A1 Oct. 5, 2006

Related U.S. Application Data

(60) Provisional application No. 60/666,698, filed on Mar. 31, 2005.

(30) Foreign Application Priority Data

Mar. 31, 2005 (JP) .............................. 2005-102586

(51) Int. Cl.
*H01L 21/302* (2006.01)
(52) U.S. Cl. .......................................... 216/59; 216/61
(58) Field of Classification Search .................. 216/59; 219/121.36
See application file for complete search history.

(56) References Cited

U.S. PATENT DOCUMENTS 5,272,417 A * 12/1993 Ohmi .................... 315/111.21
5,288,971 A * 2/1994 Knipp ..................... 219/121.57
5,602,865 A * 2/1997 Laakmann .................... 372/82
6,424,232 B1 * 7/2002 Mavretic et al. ........... 333/17.3
2001/0025691 A1 * 10/2001 Kanno et al. ................. 156/345

OTHER PUBLICATIONS

Manitou Stystems, Inc; Model MTK-600 RF Manual Impedance Matching System; 2001.*
Muller; Direct power coupling into a waveguide cavity plasma source; Surface and Coatings Technology 116-119 (1999) 674-678.*

* cited by examiner

*Primary Examiner*—Keith D Hendricks
*Assistant Examiner*—Patricia A George
(74) *Attorney, Agent, or Firm*—Oblon, Spivak, McClelland, Maier & Neustadt, L.L.P.

(57) ABSTRACT

A plasma processing apparatus includes an upper matching unit 44 which is a variable matching unit whose impedance can be varied, and a main controller 100. The upper matching unit 44 includes a controller 104 for variably controlling the impedance positions of a variable reactance element of a matching circuit 102, a RF sensor for measuring a load impedance including the matching circuit 102, and a $V_{PP}$ measuring circuit 112 for measuring a peak value (peak-to-peak value) of a radio frequency voltage in a waveguide line at the output side of the upper matching unit 44. The main controller 100 executes and controls an autorunning of the matching units 44, 88 for optimizing an off preset of the impedance positions thereof. The plasma can be readily get ignited without requiring to set or change special processing conditions while influencing none of the processes.

7 Claims, 11 Drawing Sheets

FIG.5A
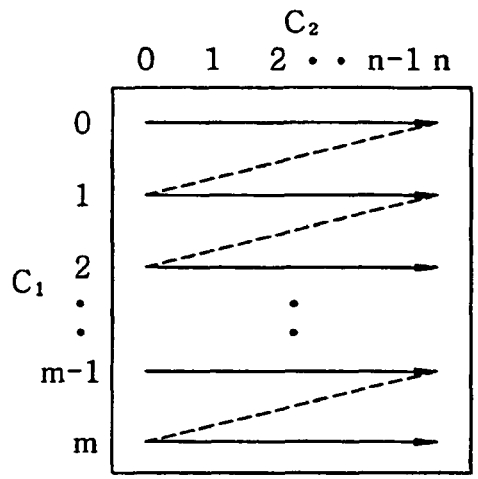
FIG.5B
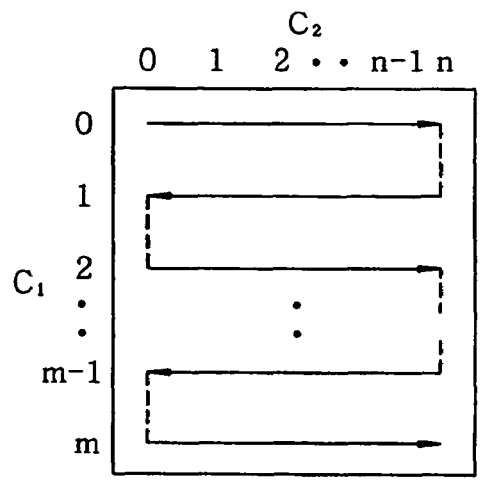
FIG.6
| | POSITION OF $C_2$ | | | | | | | | | |
|---|---|---|---|---|---|---|---|---|---|---|
| | | 0 | 1 | 2 | • | • • • • | • | n-1 | n |
| POSITION OF $C_1$ | 0 | $V_{0,0}$ | $V_{0,1}$ | $V_{0,2}$ | | | | $V_{0,n-1}$ | $V_{0,n}$ |
| | 1 | $V_{1,0}$ | $V_{1,1}$ | $V_{1,2}$ | | • • • | | $V_{1,n-1}$ | $V_{1,n}$ |
| | 2 | $V_{2,0}$ | $V_{2,1}$ | $V_{2,2}$ | | | | $V_{2,n-1}$ | $V_{2,n}$ |
| | • | • | • | • | | | | | • |
| | • | • | • | • | | | | | |
| | • | • | • | • | | $V_{i,j}$ | | | • |
| | • | • | • | | | | | | |
| | • | • | • | | | | | | |
| | m-1 | $V_{m-1,0}$ | $V_{m-1,1}$ | $V_{m-1,2}$ | | | | $V_{m-1,n-1}$ | $V_{m-1,n}$ |
| | m | $V_{m,0}$ | $V_{m,1}$ | $V_{m,2}$ | • | • • | | $V_{m,n-1}$ | $V_{m,n}$ |

| Zs=R+jX | R=40 | R=45 | R=50 | R=55 | R=60 | R=65 | R=70 |
|---------|------|------|------|------|------|------|------|
| X=10    | ×    | ×    | ×    | ×    | △    | △    | △    |
| X=5     | ×    | ×    | ×    | ×    | ○    | ○    | △    |
| X=0     | ×    | ×    | ×    | ×    | ○    | ○    | ○    |
| X=-5    | ×    | ×    | ○    | ○    | ○    | ○    | ○    |
| X=-10   | ×    | ×    | ○    | ○    | ◎    | ○    | ○    |
| X=-15   | ○    | ○    | ○    | ○    | ○    | ○    | ○    |
| X=-20   | ○    | ○    | ○    | ○    | ○    | ○    | ○    |

○ STABLE WITHIN INTERLOCK RANGE (◎ MINIMUM VALUE OF REFELCTED WAVE POWER)
△ ERROR OF UPPER LIMIT VALUE OF REFLECTED WAVE
× OCCURRENCE OF REFLCETED WAVE HUNTING

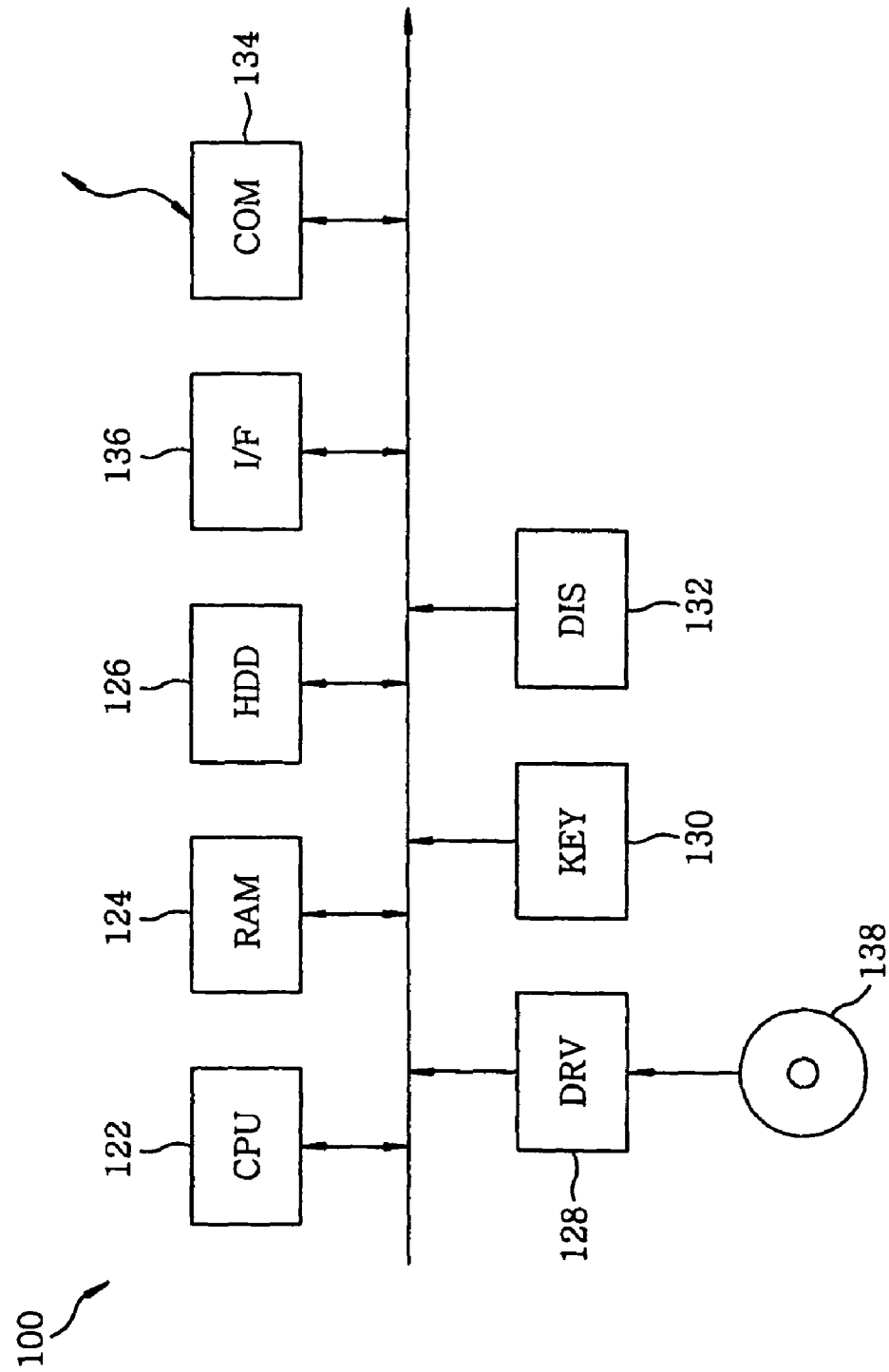

PLASMA PROCESSING METHOD AND APPARATUS, AND AUTORUNNING PROGRAM FOR VARIABLE MATCHING UNIT

FIELD OF THE INVENTION

The present invention relates to a plasma processing technology; and, more particularly, to an improved system for applying a desired radio frequency power to a radio frequency electrode for a plasma generation via a variable matching unit.

BACKGROUND OF THE INVENTION

In manufacturing a semiconductor device or a flat panel display (FPD), there has been widely used a plasma processing apparatus for performing, e.g., an etching, a depositing, an oxidizing and a sputtering process by using a plasma. Generally, in the plasma processing apparatus, a radio frequency power supply unit applies a radio frequency power to a radio frequency electrode disposed inside or outside a processing vessel or chamber. The radio frequency power supply unit includes an oscillator or a radio frequency power source for outputting a radio frequency power and a matching unit for matching an impedance at the side of a load (electrode, plasma and chamber) with an impedance at the side of the radio frequency power source. Since the radio frequency power source is typically designed as a pure resistance output of 50Ω, the impedance of the matching unit is set or adjusted such that the impedance at the load side including the matching unit becomes 50Ω (see, e.g., Japanese Patent Laid-open publication No. 11-61456).

In general, such type matching unit includes one or more variable reactance elements such as a variable capacitor and a variable inductance coil, and serves as a variable matching unit capable of variably adjusting the impedance in the matching unit or the load impedance by selecting each step or position within a variable range with, e.g., a stepper motor. Further, during a plasma processing, if a plasma impedance is changed due to a pressure variation, the matching unit variably adjusts the impedance position of the variable reactance elements to make the load impedance automatically coincide with the matching point 50Ω. In order to carry out such auto-matching, there are used circuits for measuring the load impedance and a controller for variably controlling the impedance positions of the variable reactance elements by using the stepper motor such that the measured load impedance coincides with the matching point 50Ω.

In the conventional plasma processing apparatus, the impedance position of the matching unit before or upon a plasma ignition is set to coincide with a position corresponding to the matching point or a position close to that. However, when the gas pressure in the chamber is low, the plasma is difficult to get ignited. Such trend becomes particularly conspicuous in a parallel plate type plasma processing apparatus.

As an approach for dealing with the problem that the plasma is not to get ignited, there has been proposed in the Japanese Patent Laid-open Publication No. 11-61456 a method wherein the radio frequency power starts to be applied under a higher pressure than a level required for the plasma processing and then the pressure is lowered to the required level after the plasma ignition. However, such a method is cumbersome in that an optimal initial pressure for the plasma ignition should be set for every process, and further it is not assured that the plasma will be securely ignited under an initial pressure slightly higher than the required level. Meanwhile, if the initial pressure is much higher than the required level, the transition of the pressure after the plasma ignition may affect the process.

SUMMARY OF THE INVENTION

It is, therefore, an object of the present invention to provide a plasma processing method and apparatus and an autorunning program for a matching unit capable of readily improving the plasma ignition with no particular selection or change of processing conditions while influencing none of the processes.

Another object of the present invention is to provide a plasma processing apparatus and method capable of improving auto-matching reliability for automatically matching a load impedance to an impedance of the radio frequency power source side during the plasma processing.

In accordance with an aspect of the present invention, there is provided a first plasma processing method for performing a plasma process on a substrate disposed in a depressurizable chamber by applying a first radio frequency power of a first frequency from a first radio frequency power supply to a first radio frequency electrode disposed inside or outside the chamber via a first variable matching unit to generate a plasma in the chamber, the method including: a first step of initiating the application of the first radio frequency power to the first radio frequency electrode under a first impedance where a peak value of a radio frequency voltage obtained at the first radio frequency electrode becomes a maximum value or a value close to it among variable impedances in the first variable matching unit, for igniting the plasma in the chamber; and a second step of variably controlling an impedance of the first variable matching unit such that a load impedance is matched to an impedance at the side of the first radio frequency power supply after the plasma is ignited in the chamber.

In accordance with another aspect of the present invention, there is provided a plasma processing apparatus including: a chamber having a depressurized space in which a plasma process is performed on a substrate to be processed; a first radio frequency electrode for a plasma generation disposed inside or outside the chamber; a processing gas supply source for supplying a processing gas into the chamber; a gas exhaust unit for evacuating the inside of the chamber; a first radio frequency power supply for outputting a first radio frequency power of a first frequency for generating a plasma; a first variable matching unit electrically connected between the first radio frequency power supply and the first radio frequency electrode; and a first matching controller for variably controlling the impedance of the first variable matching unit such that the application of the first radio frequency power to the first frequency electrode is initiated under a first impedance where a peak value of a radio frequency voltage obtained at the first radio frequency electrode becomes a maximum value or a value close to it among variable impedances in the first variable matching unit in order to ignite the plasma in the chamber, and a load impedance is matched to an impedance at the side of the first radio frequency power supply after the ignition of the plasma in the chamber.

With the above-described configuration, when the first radio frequency power from the first radio frequency power source is applied to the first radio frequency electrode, a maximum peak value of voltage or a value close to it, which is available in a variable range of impedance of the first variable matching unit, is obtained at the first radio frequency electrode, so that the electric discharge of the processing gas is facilitated at a maximum to generate a plasma of the processing gas. Further, after the ignition of the plasma, the variable matching unit is converted from the fixed impedance (the first impedance) to a variable impedance, the impedance matching is carried out between the first radio frequency power supply and the load even tough the impedance of the plasma is varied, thereby maintaining the plasma process stable.

In order to determine the off preset value of the impedance of the first variable matching unit, it is preferable that the plasma processing method of the present invention further includes: a third step of depressurizing the inside of the chamber, applying to the first radio frequency electrode the first radio frequency power at a level that causes no electric discharge and changing the impedance of the first variable matching unit to a plurality of impedance positions determined within a variable range step by step; a fourth step of measuring a peak value of a radio frequency voltage obtained in a waveguide line from an output terminal of the first variable matching unit to the first radio frequency electrode under the respective impedance positions and recording the measured value; and a fifth step of registering an impedance position at a time when the measured voltage peak value becomes the maximum value or the value close to it among the plurality of impedance positions as an impedance position corresponding to the first impedance. Here, at the third step, it is preferable that the plurality of impedance positions are determined to cover the substantially entire variable range.

Further, in the plasma processing method or apparatus, it is preferable that the first radio frequency electrode and a second radio frequency electrode are disposed in parallel with a gap therebetween in the chamber, a second radio frequency power of a second frequency is applied from a second radio frequency power supply to the second radio frequency electrode via a second matching unit. In this case, the application of the second radio frequency power to the second radio frequency electrode is initiated after the plasma is ignited in the chamber. It is preferable to initiate the application of the second radio frequency power under a second impedance where a peak value of a radio frequency voltage obtained at the second radio frequency electrode becomes a minimum value or a value close to it among variable impedances in the second variable matching unit; and to variably control an impedance of the second variable matching unit such that the load impedance is matched to an impedance at the side of the second radio frequency power supply after a predetermined time period from the time the application of the second radio frequency power is initiated. In this way, the influence of the second radio frequency power on the plasma generated by the first radio frequency power can be suppressed at a minimum.

Further, in the configuration that the radio frequency electrode and the opposite electrode are disposed in parallel, the substrate to be processed may be mounted on the radio frequency electrode and the opposite electrode may be provided with gas injection holes through which the processing gas is injected toward the radio frequency electrode. Alternatively, the substrate to be processed may be mounted on the opposite electrode and the radio frequency electrode may be provided with gas injection holes through which the processing gas is injected toward the opposite electrode.

In order to determine the off preset value of the impedance of the first variable matching unit, preferably, the plasma processing method of the present invention further includes: an eighth step of depressurizing the inside of the chamber, applying to the second radio frequency electrode the second radio frequency power at a level that causes no electric discharge and changing the impedance of the second variable matching unit to a plurality of impedance positions determined within a variable range step by step; a ninth step of measuring a peak value of a radio frequency voltage obtained on a waveguide line from an output terminal of the second variable matching unit to the second radio frequency electrode under the respective impedance positions and recording the measured value; and a tenth step of registering an impedance position at a time when the measured voltage peak value becomes the minimum value or the value close to it among the plurality of impedance positions as an impedance position corresponding to the second impedance. Here, at the tenth step, it is preferable that the plurality of impedance positions are determined to cover the substantially entire variable range.

In accordance with still another aspect of the present invention, there is provided a second plasma processing method including: a first step of disposing a dummy substrate at a specified position in a depressurizable chamber, depressurizing the inside of the chamber to a predetermined vacuum level under the substantially same conditions as a desired process recipe, supplying a processing gas into the chamber, applying a radio frequency power of a predetermined frequency at a level from the radio frequency power supply to a radio frequency electrode via a variable matching unit to generate a plasma in the chamber, and variably controlling the impedance of the variable matching unit such that a measured value of a load impedance is matched to a plurality of reference impedance which are determined in advance; a second step of measuring a power of a reflected wave obtained at the side of the radio frequency power supply under the respective reference impedances and recording the measured values; a third step of registering a reference impedance at a time when the measured value of the reflected wave power becomes a minimum value or a value close to it among the plurality of reference impedances; a fourth step of disposing a substrate to be processed at the specified position in the chamber, depressurizing the inside the chamber to the predetermined vacuum level under the conditions of the process recipe, supplying a processing gas into the chamber, applying a predetermined magnitude of the radio frequency power from the radio frequency power supply to the radio frequency electrode via the variable matching unit to generate a plasma in the chamber, and variably controlling the impedance of the variable matching unit such that the measured value of the load impedance is matched to the registered reference impedance, thereby performing a plasma process on the substrate.

In the plasma processing apparatus of the present invention, it is preferable that the first matching controller includes a first load impedance measuring circuit for measuring the load impedance; and a first auto-matching controller for variably controlling the impedance of the first variable matching unit such that the measured value of the load impedance coincides with a reference impedance at a time when the power of the reflected wave obtained at the side of the first radio frequency power supply becomes the minimum value or the value close to it. Further, it is preferable that the second matching controller includes a second load impedance measuring circuit for measuring the load impedance; and a second auto-matching controller for variably controlling the impedance of the second variable matching unit such that the measured value of the load impedance coincides with a reference impedance at a time when the power of the reflected wave obtained at the side of the second radio frequency power supply becomes the minimum value or the value close to it.

With the above-described method and apparatus, even if there occurs a measuring error in the load impedance measuring circuit or the wave distortion of the radio frequency during the actual process is large, the auto-matching is operated so as to make the power of the reflected wave minimum without depending on the seeming measured value of the load impedance, so that the reliability of the auto-matching function is guaranteed.

In accordance with the plasma processing method and apparatus and the matching unit autorunning program of the present invention, it is possible to readily improve the plasma ignition without requiring to set or change special processing conditions while influencing none of the processes. Further, it is possible to improve the auto-matching reliability for automatically matching a load impedance to an impedance of the radio frequency power source side during a plasma processing.

BRIEF DESCRIPTION OF THE DRAWINGS

The above and other objects and features of the present invention will become apparent from the following description of preferred embodiments, given in conjunction with the accompanying drawings, in which:

FIGS. 5A and 5B provide exemplary sequences for shifting the impedance positions of the variable capacitors step by step in the autorunning of the first example;

FIG. 6 presents a mapping of measured values of $V_{PP}$ obtained at the respective impedance positions of the variable capacitor in the autorunning of the first example;

FIG. 13 represents an exemplary configuration of a main controller in accordance with the second example.

DETAILED DESCRIPTION OF THE PREFERRED EMBODIMENT

Hereinafter, preferred embodiments of the present invention will be described with reference to the accompanying drawings.

Figure 1:
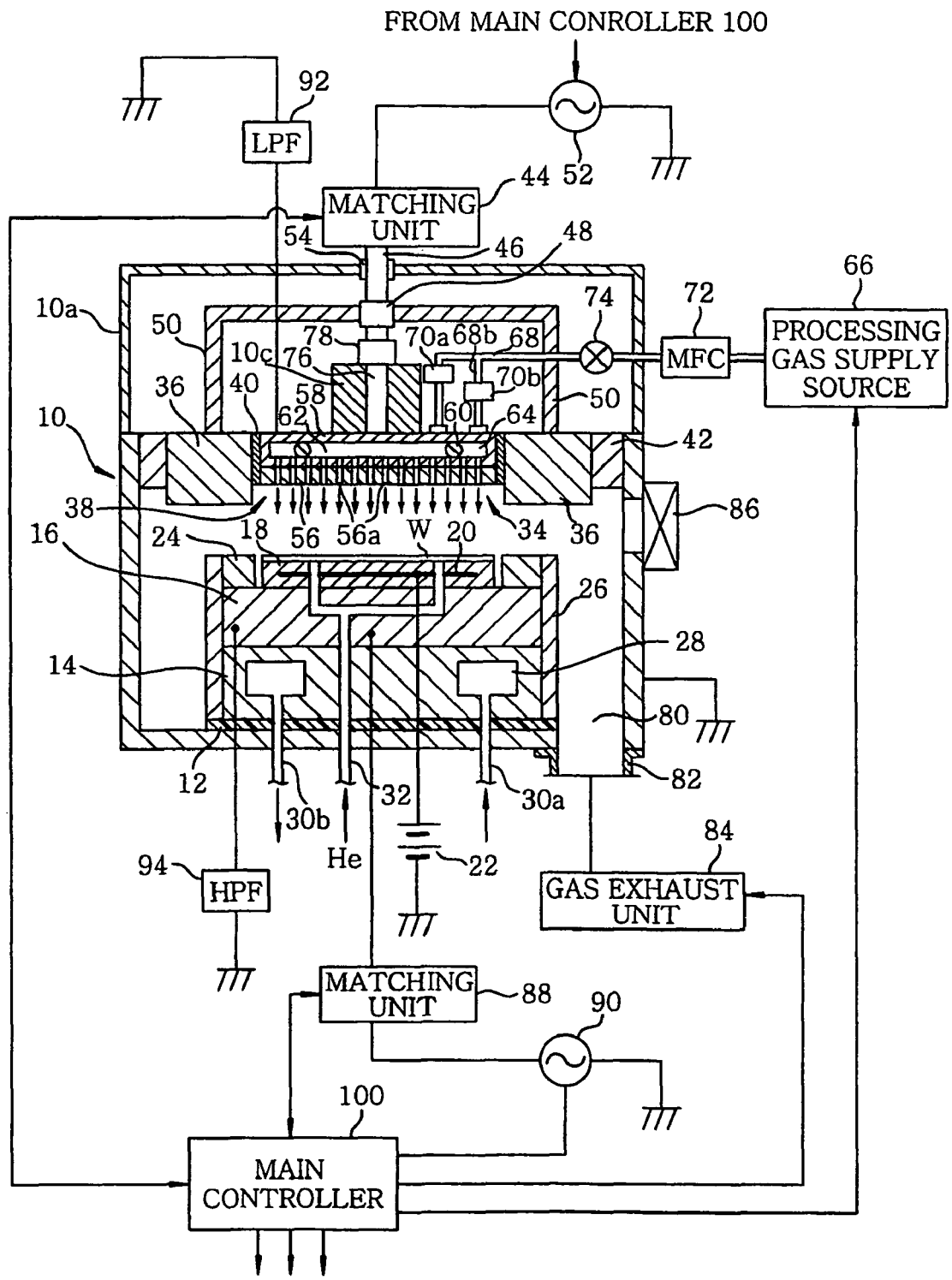
FIG. 1 is a schematic cross-sectional view of a plasma etching apparatus in accordance with a preferred embodiment of the present invention.

FIG. 1 shows a configuration of a plasma etching apparatus in accordance with a preferred embodiment of the present invention. The plasma etching apparatus is a capacitively coupled parallel plate type plasma etching apparatus having a cylindrical chamber (processing chamber) 10 made of aluminum whose surface is alumite-treated (anodically oxidized). The chamber 10 is frame grounded.

A columnar susceptor support 14 is provided on a bottom of the chamber 10 via an insulating plate 12 made of ceramic or the like. Further, a susceptor 16 made of, e.g., aluminum is installed on the susceptor support 14. The susceptor 16 forms a lower electrode, and a semiconductor wafer W as a substrate to be processed is mounted thereon.

Provided on top of the susceptor 16 is an electrostatic chuck 18 for supporting the semiconductor wafer W with the help of an electrostatic adsorptive force. The electrostatic chuck 18 has a structure in which an electrode 20 made of a conductive film is inserted by being sandwiched between a pair of insulating layers or sheets, and a DC power supply 22 is electrically connected to the electrode 20. Further, the semiconductor wafer W is adsorptively held on the electrostatic chuck 18 by a Coulomb force generated by a DC voltage from the DC power supply 22. To improve the etching uniformity, a focus ring 24 is provided on a top surface of the susceptor 16, wherein the focus ring 24 is made of, e.g., silicon and surrounds the electrostatic chuck 18. A cylindrical inner wall member 26 made of, e.g., quartz is provided on lateral surfaces of the susceptor 16 and the susceptor support 14.

A coolant passageway 28 is circumferentially provided inside the susceptor support 14. A coolant, e.g., cooling water kept at a predetermined temperature is supplied from a chiller unit (not shown) installed at an outside into the coolant passageway 28 through lines 30a and 30b to be circulated therein, so that a processing temperature of the semiconductor wafer W on the susceptor 16 can be controlled by using the temperature of the coolant. Moreover, a thermally conductive gas, e.g., He gas, is supplied from a thermally conductive gas supply unit (not shown) to a space between the top surface of the electrostatic chuck 18 and a bottom surface of the semiconductor wafer W through a gas supply line 32.

An upper electrode 34 is installed above the susceptor 16 so as to face the susceptor 16 in parallel. Furthermore, a space between the upper and the lower electrode 16 and 34 becomes a plasma generation region. The upper electrode 34 includes a facing surface, i.e., a surface being in contact with the plasma generation region while facing the semiconductor wafer W on the susceptor (lower electrode) 16. The upper electrode 34 includes an annular or a donut-shaped outer upper electrode 36 which faces the susceptor 16 and is separated therefrom by a predetermined distance; and a circular plate shaped inner upper electrode 38 provided at a radially inner side of the outer upper electrode 36 with an insulating member interposed therebetween. The outer and the inner upper electrode 36 and 38 play a main and a secondary role in a plasma generation, respectively.

Figure 2:
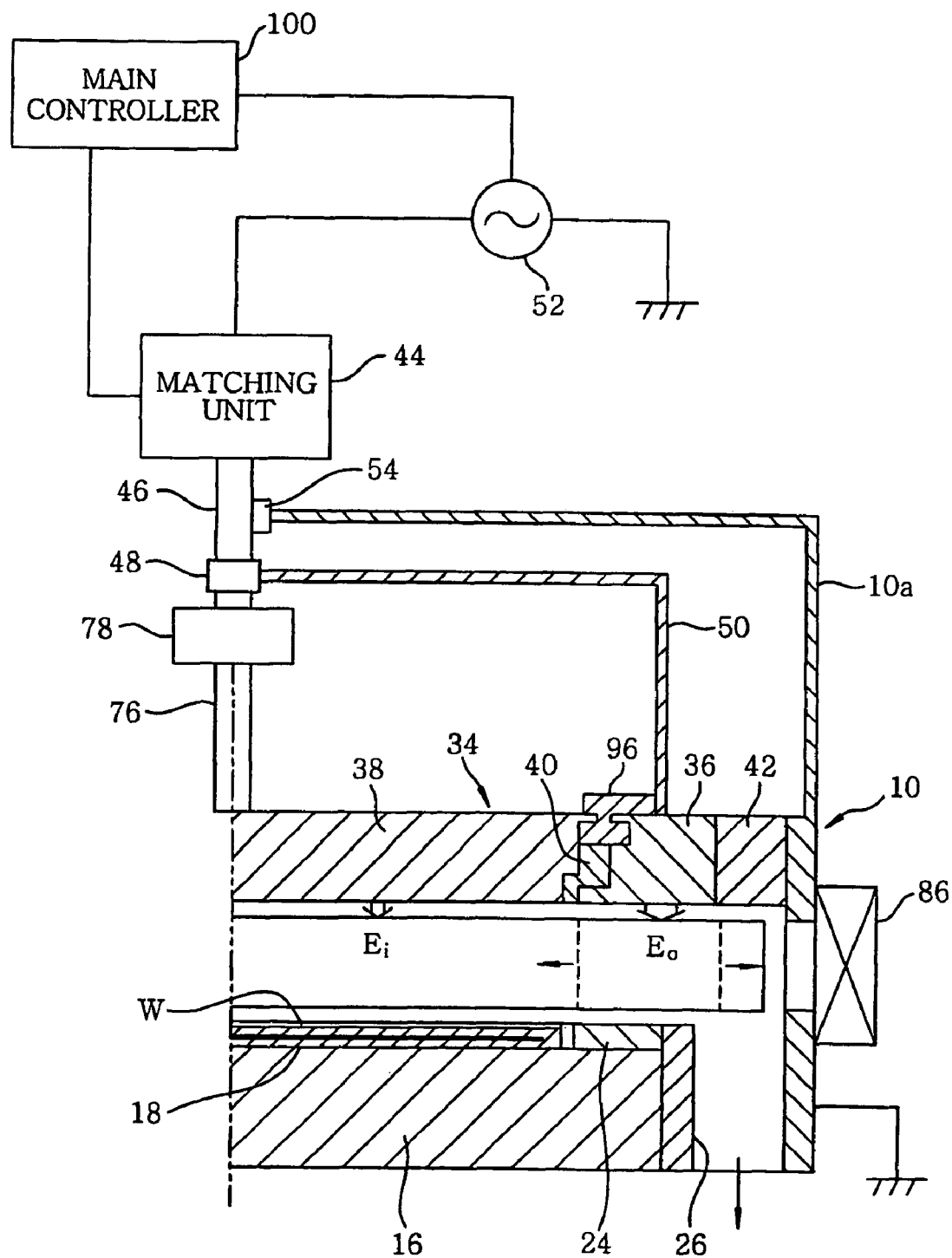
FIG. 2 shows a partially enlarged cross-sectional view illustrating a radio frequency power supply unit in the plasma etching apparatus shown in FIG. 1.

FIG. 2 shows a configuration of an upper radio frequency power supply unit in the plasma etching apparatus. As shown in FIG. 2, an annular gap of about 0.25 to 2.0 mm is formed between the outer upper electrode 36 and the inner upper electrode 38, and a dielectric material 40 made of, e.g., quartz is provided in the gap. Further, a ceramic 96 may be provided in the gap. A capacitor is formed between the electrodes 36 and 38 having the dielectric material 40 inbetween. The capacitance $C_{40}$ of the capacitor is selected or adjusted to a desired value determined on the basis of a size of the gap and a dielectric constant of the dielectric material 40. An annular insulating shielding member 42 made of, e.g., alumina ($Al_2O_3$) is airtightly attached between the outer upper electrode 36 and a sidewall of the chamber 10.

The outer upper electrode 36 is preferably made of a conductor or a semiconductor of a low resistance with low Joule heat, e.g., silicon. An upper radio frequency power supply 52 is electrically connected to the outer upper electrode 36 via a matching unit 44, an upper power feed rod 46, a connector 48 and a cylindrical power feeder 50. The upper radio frequency power supply 52 outputs a radio frequency of 13.56 MHz or higher, e.g., 60 MHz for plasma generation. The matching unit 44 matches a load impedance to an internal (or an output) impedance of the upper radio frequency power supply 52. When a plasma is generated in the chamber 10, the matching unit 44 serves to make the output impedance of the first radio frequency power supply 52 and the load impedance coincide with each other seemingly. An output terminal of the matching unit 44 is connected to a top portion of the upper power feed rod 46.

The cylindrical power feeder 50 is made of a conductive plate, e.g., an aluminum plate or a copper plate, of a cylindrical or conical shape or the like. A lower end thereof makes a continuous circumferential contact with the outer upper electrode 36 to be connected thereto, whereas an upper end thereof is electrically connected to a lower end portion of the upper power feed rod 46 by a connector 48. Outside the cylindrical power feeder 50, a sidewall of the chamber 10 upwardly extends to a position higher than the upper electrode 34 to form a cylindrical grounding conductor 10a. An upper end portion of the cylindrical grounding conductor 10a is electrically insulated from the upper power feed rod 46 by a tubular insulation member 54. In such a configuration, in a load circuit viewed from the connector 48a, a coaxial cable path is formed with the cylindrical power feeder 50, the outer upper electrode 36 and the cylindrical grounding conductor 10a, wherein the cylindrical power feeder 50 and the outer upper electrode 36 serving as a waveguide line.

Referring back to FIG. 1, the inner upper electrode 38 includes an electrode plate 56 having a plurality of gas injection openings 56a, the electrode plate 56 being formed of a semiconductor material such as silicon, silicon carbide or the like; and an electrode support 58 formed of a conductive material, e.g., aluminum, whose surface is alumite-treated, for detachably supporting the electrode plate 56. Provided inside the electrode support 58 are a central gas introduction room 62 and a peripheral gas introduction room 64 partitioned by an annular partition member 60 formed of, e.g., an O-ring. A central shower head is formed by the central gas introduction room 62 and a plurality of gas injection openings 56a provided in a bottom surface thereof, while a peripheral shower head is formed by the gas introduction room 64 and a plurality of gas injection openings 56a provided in a bottom surface thereof.

A processing gas is supplied at a desired flow rate from a common processing gas supply source 66 into the two gas introduction rooms 62 and 64. Specifically, a gas supply line 68 is divided into two branch lines 68a and 68b which are in turn connected to the gas introduction rooms 62 and 64, respectively, wherein branch lines 68a and 68b are provided with flow rate control valves 70a and 70b, respectively. Since a conductance of a flow path from the processing gas supply source 66 to the gas introduction room 62 and that to the gas introduction room 64 are substantially same, the flow rates of the processing gas supplied to the central and the peripheral gas introduction room 62 and 64 can be arbitrarily controlled by the flow rate control valves 70a and 70b, respectively. The gas supply line 68 is provided with a mass flow controller MFC 72 and an openable/closable valve 74. As described above, by controlling the flow rates of the processing gas to be introduced into the central and the peripheral gas introduction room 62 and 64, it is possible to arbitrarily control a ratio of a flow rate Fc of the gas injected through the central shower head to a flow rate Fe of the gas injected through the peripheral shower head, i.e., Fc/Fe. Furthermore, it is also possible to vary the flow rates of the processing gas per unit area, the processing gas being respectively injected through the central and the peripheral shower head. Furthermore, types and mixing ratios of the processing gas respectively injected through the central and the peripheral shower head may be independently or separately selected.

Electrically connected to the electrode support 58 of the inner upper electrode 38 is the upper radio frequency power supply 52 via the matching unit 44, the upper power feed rod 46, the connector 48 and the lower power feed rod 76. A variable capacitor 78 for variably controlling a capacitance is provided in the middle of the lower power feed rod 76.

Although not illustrated, the outer and the inner upper electrode 36 and 38 may be provided with an appropriate cooling chamber or cooling jacket to control temperatures thereof by using a coolant from a chiller unit provided outside.

A gas exhaust port 80 is provided at a bottom of the chamber 10, and a gas exhaust unit 84 is connected to the gas exhaust port 80 via a gas exhaust line 82. The gas exhaust unit 84 can depressurize the inside of the chamber 10 to a desired vacuum level with a vacuum pump such as a turbo-molecular pump or the like. Moreover, there is provided at a sidewall of the chamber 10 a gate valve 86 for opening and closing an opening through which the semiconductor wafer W is loaded into and unloaded from the chamber 10.

In such a plasma etching apparatus, a lower radio frequency power supply 90 is electrically connected via a matching unit 88 to the susceptor 16 serving as a lower electrode. The lower radio frequency power supply 90 outputs a radio frequency power of a frequency ranging from 2 MHz to 27 MHz, e.g., 2 MHz, for attracting ions. The matching unit 88 matches the load impedance to an internal (or output) impedance of the lower radio frequency power supply 90. When a plasma is generated in the chamber 10, the matching unit 88 makes the internal impedance of the radio frequency power supply 90 and the load impedance coincide with each other seemingly.

Electrically connected to the inner upper electrode 38 is a low pass filter (LPF) 92 for passing the radio frequency (2 MHz) from the lower radio frequency power supply 90 to the ground without passing the radio frequency (60 MHz) from the upper radio frequency power supply 52 therethrough. Although the LPF 92 preferably includes an LR filter or an LC filter, it may also include a single conducting wire capable of providing sufficient reactance to the radio frequency (60 MHz) from the upper radio frequency power supply 52. Meanwhile, electrically connected to the susceptor 16 is a high pass filter (HPF) 94 for passing the radio frequency (60 MHz) from the upper radio frequency power supply 52 to the ground.

A main control unit 100 includes a computer system provided with a CPU, a memory and the like and controls individual operation and an overall operation (sequence) of the respective parts in the apparatus, particularly, the radio frequency power supplies 52, 90, the processing gas supply source 66 and the matching units 44, 88. The configuration of the main control unit 100 will be described later with reference to FIG. 13.

In the plasma etching apparatus, in order to perform an etching process, the gate valve 86 is first opened and a semiconductor wafer W to be processed is loaded into the chamber 10 to be mounted on the susceptor 16. Next, a DC voltage is applied from the DC power supply 22 to the electrode 20 of the electrostatic chuck 18 to hold the semiconductor wafer W on the susceptor 16. Subsequently, an etching gas (generally, a gaseous mixture) from the processing gas supply source 66 is introduced into the gas introduction rooms 62, 64 at predetermined flow rates, respectively, while the gas exhaust unit 84 evacuates the inside of the chamber 10. The pressure in the chamber 10 or the chamber pressure is set to be maintained at a predetermined value (e.g., several mTorr) by using the gas exhaust unit 84. Thereafter, a power of a radio frequency (2 MHz) is applied from the lower radio frequency power supply 90 to the susceptor 16 and then a power of a radio frequency (60 MHz) is also applied from the upper radio frequency power supply 52 to the upper electrode 34 (36 and 38). The etching gas injected through the gas openings 56a in the inner upper electrode 38 is plasmarized in a glow discharge occurring between the upper electrode 34 (36 and 38) and the susceptor (lower electrode) 16, and a to-be-processed surface of the semiconductor wafer W is etched by radicals and/or ions generated in the plasma.

As described above, there is a sequential relationship between the radio frequency power (60 MHz) outputted from the upper radio frequency power supply 52 and the radio frequency power (2 MHz) outputted from the lower radio frequency power supply 90. That is, the radio frequency power (2 MHz) for attracting the ions is first applied to the lower electrode 16 and the radio frequency power (60 MHz) for generating the plasma is applied thereafter to the upper electrode 34.

In such plasma etching apparatus, by applying a radio frequency power of a radio frequency domain (above 5 MHz to 10 MHz where ions are immovable) to the upper electrode 34, it is possible to form a high density plasma in a desirable dissociation state even under a lower pressure condition. Moreover, by a function for optimizing an off preset value of impedance position in the upper matching unit 44 at the prior application side, which will be described in detail later, even under a lower pressure condition (or even if depositions are adhered to the inside of the chamber), the plasma can be securely ignited without requiring a specific selection and change of various conditions (the pressure in the chamber, the upper and the lower radio frequency power, the gas flow rate and the like) of the process recipe. Further, in the auto-matching after the plasma ignition, even if there occurs a measuring error in monitoring the load impedance, it is possible to make the matching in a high precision state by using a matching point compensating function to be described later.

Further, the aforementioned plasma etching apparatus is for etching a silicon oxide (SiO$_2$) film, and the radio frequency power (2 MHz) for attracting the ions is first applied to the lower electrode 16 and the radio frequency power (60 MHz) for generating the plasma is applied thereafter to the upper electrode 34. However, in the plasma etching apparatus for etching, e.g., a polysilicon film, there is widely employed the case where a radio frequency power (e.g., 60 MHz) is first applied to the upper electrode and a radio frequency power (e.g., 13.56 MHz) is applied thereafter to the lower electrode 16 depending on various status and conditions. In this connection, in the plasma processing apparatus for etching a polysilicon film, it is preferable to have a low pressure condition in the chamber in particular.

Hereinafter, for the sake of convenience, there will be described a case where a radio frequency power is first applied to the upper electrode and another radio frequency power is applied thereafter to the lower electrode, which is dominant in the plasma processing apparatus for etching a polysilicon film.

First Example

Figure 3:
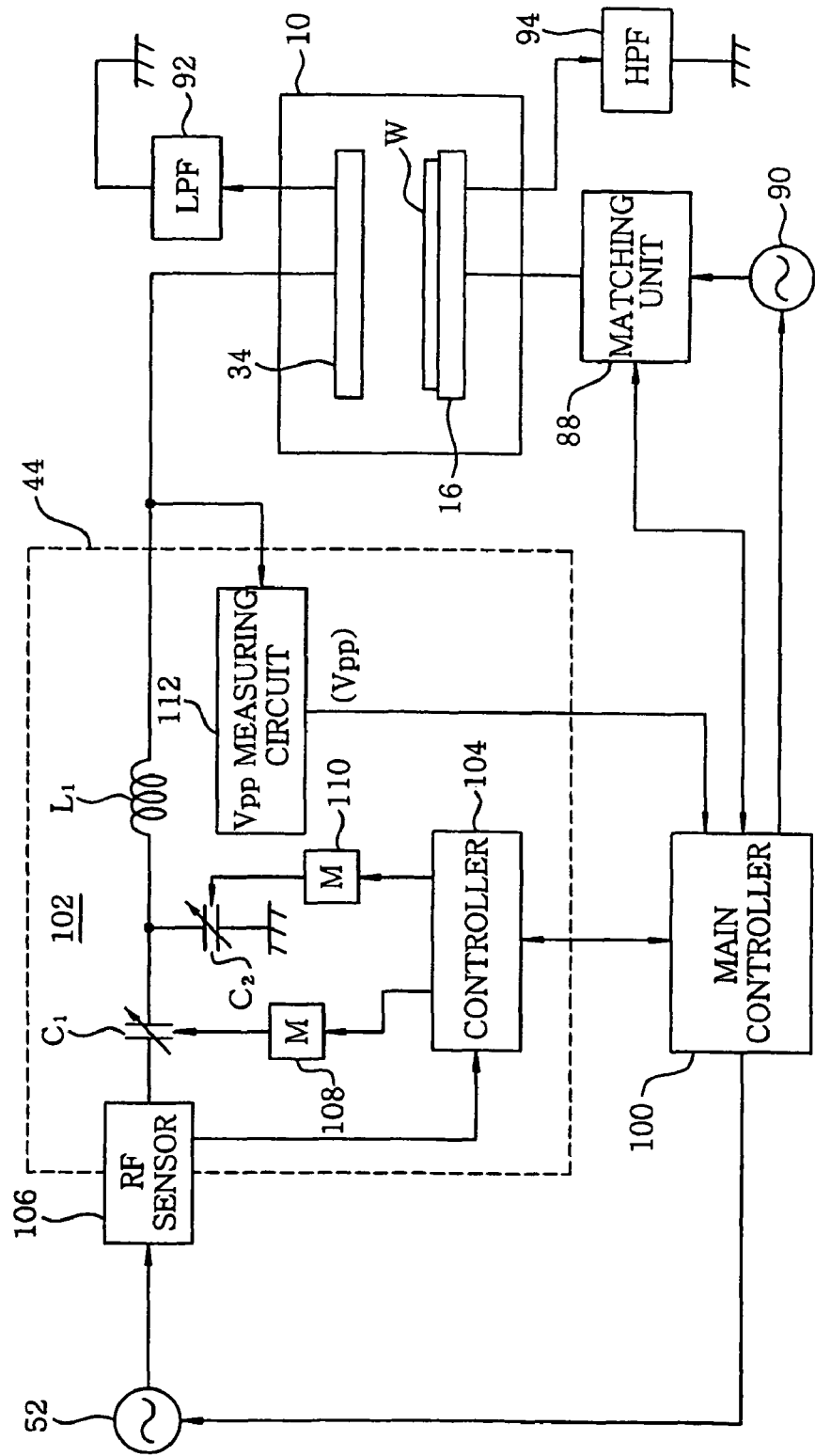
FIG. 3 is a block diagram showing a configuration of a radio frequency power supply system in accordance with a first example.

FIG. 3 shows a configuration of a radio frequency power supply system in accordance with a first example, which is applicable to the aforementioned plasma etching apparatus. The upper matching unit 44 is an impedance-variable matching unit, and includes a matching circuit 102 containing at least one variable reactance element, a controller 104 for variably controlling impedance positions of the variable reactance element of the matching circuit 102, and an RF sensor 106 for functioning to measure a load impedance $Z_{in}$ containing the matching circuit 102.

In the illustrated example, the matching circuit 102 is configured in a T-shape to have two variable capacitors $C_1$, $C_2$ and one inductance coil $L_1$, and the controller can variably control the impedance positions of the variable capacitors $C_1$, $C_2$ through respective stepper motors 108, 110. The RF sensor 106 includes a voltage sensor and a current sensor for detecting a n RF voltage and an RF current, respectively, in a transmitting line at its installation position for example, and calculates a measured value of a load impedance $Z_{in}$ in a complex form from a measured voltage value and a measured current value. The controller 104 includes a microcomputer and receives the measured value of the load impedance $Z_{in}$ from the RF sensor 106 and various set values and commands from the main controller 100.

Further, in this example, there is provided in the upper matching unit 44 a $V_{PP}$ measuring circuit 112 for measuring a peak value (peak-to-peak value) $V_{PP}$ of a radio frequency voltage in the transmitting line or waveguide line at the output side of the upper matching unit 44. The measured $V_{PP}$ value obtained in the $V_{PP}$ measuring circuit 112 is inputted into the main controller 100.

Figure 4:
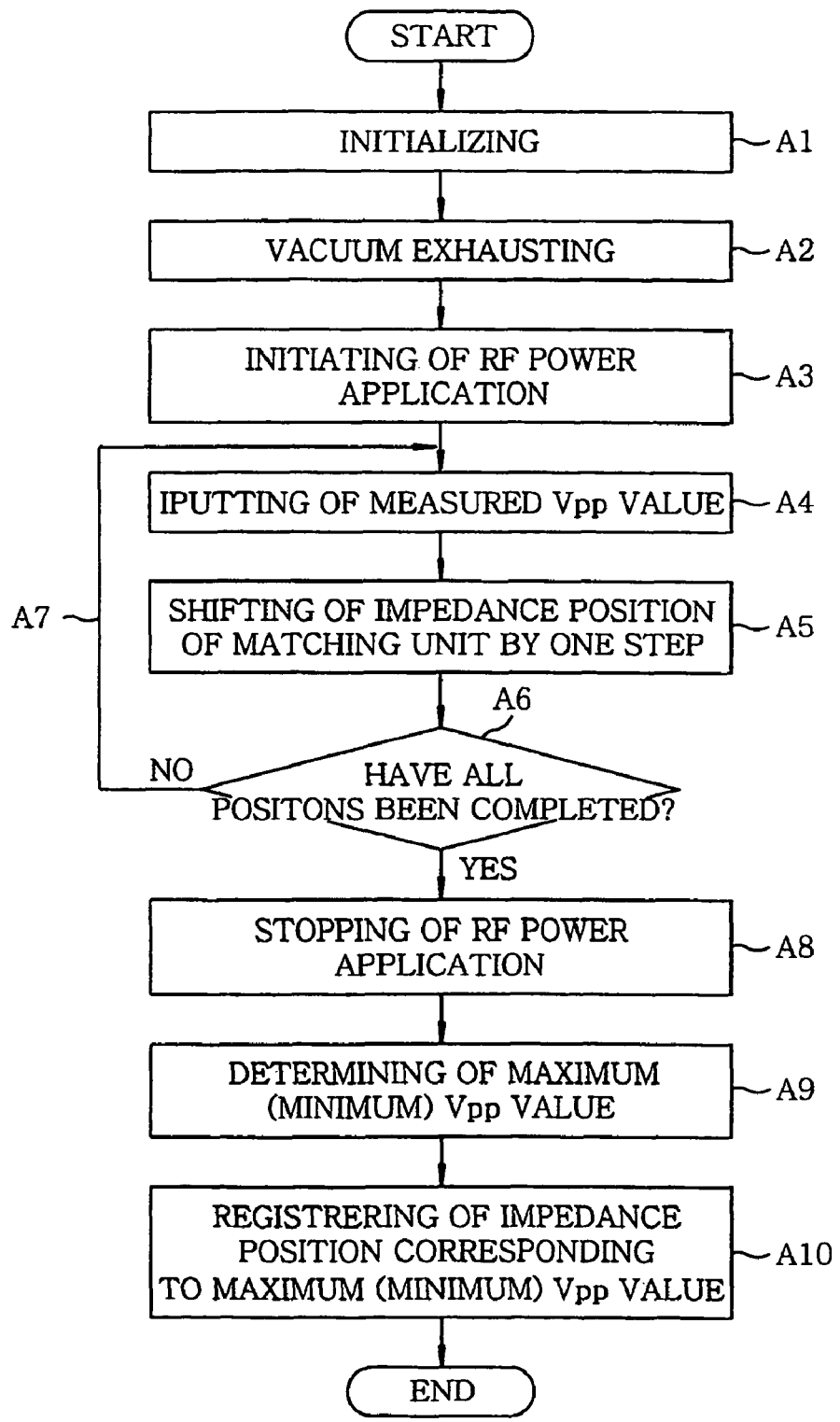
FIG. 4 describes a flow chart showing a sequence of an autorunning for optimizing an off preset value of impedance position in a matching unit in accordance with the first example.

FIG. 4 shows a sequence of an autorunning (particularly, a processing sequence of the main controller 100) performed before an operation of the apparatus, for optimizing the off preset value of impedance position in the upper and the lower matching unit 44 and 88.

There will now be described the autorunning sequence in the upper matching unit 44. First, at an initializing step (step A1), the various set values for the autorunning are set in a register and a mechanical moving part is set at its initial position. Then, while the gas exhaust unit 84 is actuated to set the pressure in the chamber 10 to be maintained at a vacuum level (step A2), the upper radio frequency power supply 52 is set ON (step A3). By doing so, the radio frequency power outputted to the transmitting line from the upper radio frequency power supply 52 is applied to the upper electrode 34 in the chamber 10 through the upper matching unit 44. At this time, the output of the upper radio frequency power supply 52 is set so low that there occurs no electric discharge between the upper electrode 34 and the lower electrode 16. Further, the lower radio frequency power supply 90 is kept OFF.

In the upper matching unit 44, the impedance positions of the capacitors $C_1$, $C_2$ are set to their initial positions at the previous initializing step and the $V_{PP}$ measuring circuit 112 measures a peak value $V_{PP}$ of the radio frequency voltage in the waveguide line at the output side under the initial impedance positions of the capacitors $C_1$, $C_2$. Here, the peak value $V_{PP}$ of the radio frequency voltage in the waveguide line measured by the $V_{PP}$ measuring circuit 112 is proportionally related to a peak value of the radio frequency voltage in the upper electrode 34. The measured $V_{PP}$ value obtained from the $V_{PP}$ measuring circuit 112 is inputted to the main controller 100 through the controller 108 and stored in the memory in the main controller 100 (step A4).

Thereafter, if the measuring of $V_{PP}$ under the initial impedance positions of the capacitors $C_1$, $C_2$ is completed, the main controller 100 shifts the impedance positions of the variable capacitors $C_1$, $C_2$ by one step through the controller 108 and the respective stepper motors 110, 112 and the measured $V_{PP}$ value obtained from the $V_{PP}$ measuring circuit 112 under the shifted impedance positions is inputted to the main controller 100 (steps A6→A7→A4). Subsequently, there are repeated a series of processes wherein the impedance positions of the variable capacitors $C_1$, $C_2$ are shifted to respective subsequent positions through the controller 108 and the respective stepper motors 110, 112 and the measured $V_{PP}$ value obtained from the $V_{PP}$ measuring circuit 112 under the shifted impedance positions is inputted to the main controller 100 (steps A5→A6→A7→A4→A5 . . . ).

FIGS. 5A and 5B show exemplary sequences for shifting the impedance positions of the variable capacitors $C_1$, $C_2$ step by step. In this example, m+1 shift positions of the variable capacitor $C_1$ are in advance set from 0 (0%) to m (100%) within a variable range (0-100%), and n+1 shift positions of the variable capacitor $C_2$ are in advance set from 0 (0%) to n (100%) within a variable range (0-100%).

In a sequence of FIG. 5A, initially, by varying the position of the variable capacitor $C_2$ from 0 to n while the position of the variable capacitor $C_1$ is kept at 0, $V_{PP}$ values are measured under respective impedance positions of $(C_1, C_2)$=(0, 0), (0, 1), . . . (0, n) and the measured values are recorded. Next, by shifting the position of the variable capacitor $C_1$ to 1 and varying the position of the variable capacitor $C_2$ from 0 to n, $V_{PP}$ values are measured under respective impedance positions of $(C_1, C_2)$=(1, 0), (1, 1), . . . (1, n) and the measured values are recorded. Thereafter, as similarly to the above, the measurement and the recording (logging) of $V_{PP}$ values are repeated while sequentially shifting the position of the variable capacitor $C_1$ to 2, 3, . . . , and finally $V_{PP}$ values are measured under respective impedance positions of $(C_1, C_2)$= (m, 0), (1, 1), . . . (m, n) and the measured values are recorded. In this case, the variation pitch of the variable capacitors ($C_1$, $C_2$) is not limited to 1, but may be 2 or greater.

Meanwhile, a sequence of FIG. 5B has a feature that the position of the variable capacitor $C_2$ is shifted in an increasing order (0, 1, 2, 3, . . . ) when the position of the variable capacitor $C_1$ is an even number (0, 2, 4, . . . ), whereas the position of the variable capacitor $C_2$ is shifted in a decreasing order (n, n−1, n−2, . . . ) when the position of the variable capacitor $C_1$ is an odd number (1, 3, 5, . . . ). The other parts of the FIG. 5B are same as those of the FIG. 5A. The sequence of FIG. 5B has a better efficiency than that of FIG. 5A since there is no need to return the stepper motor 108 at the side of the variable capacitor $C_2$ whenever the position of the variable capacitor $C_1$ is shifted by one step.

As a result of the aforementioned logging, there are prepared in the memory of the main controller 100 all of the $V_{PP}$ values corresponding to all of the impedance positions selected within the variable range of the variable capacitors $C_1$, $C_2$ (including whole positions).

Figure 7:
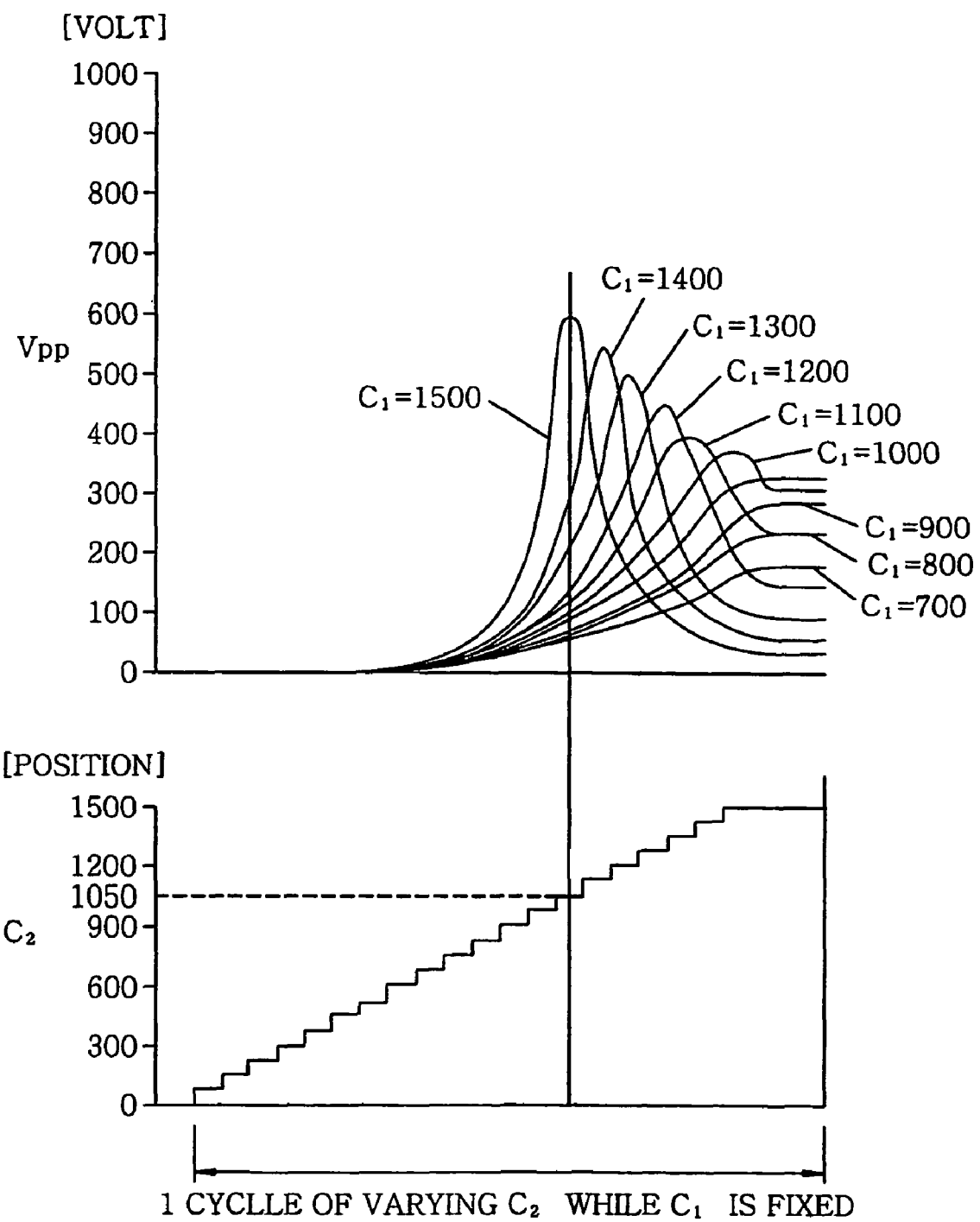
FIG. 7 represents an exemplary distribution of the measured $V_{PP}$ values by using characteristic curves.

FIG. 7 shows an exemplary distribution of the measured $V_{PP}$ values by using characteristic curves. The characteristic curves are obtained by varying the position of the variable capacitor $C_1$ by 100 pitches and the position of the variable capacitors $C_2$ by 75 pitched, where the variable range of each of the variable capacitors $C_1$, $C_2$ is 0-1500 steps. In this example, it is found that the measured $V_{PP}$ value (about 640 volts) obtained at the position of $(C_1, C_2)$=(1500, 1050) is a maximum value or a value close to it.

The main controller 100 makes the upper radio frequency power supply 52 OFF after the completion of the logging (step A8), determines the maximum value among all of the measured $V_{PP}$ values stored in the memory by using a maximum value determining process (comparison operation), and registers an impedance position of the variable capacitors $C_1$, $C_2$ corresponding to the maximum $V_{PP}$ value as the position at a time when the upper RF application is initiated for a plasma processing, i.e., the optimal off preset position for the plasma ignition (step A10).

The lower matching unit 88 is also a variable matching unit having the same configuration or function as that of the upper matching unit 44 and the autorunning sequence for optimizing the off preset of the impedance position in the lower matching unit 88 is basically identical to the autorunning sequence in the upper matching unit described above. However, although, in the autorunning in the upper matching unit 44 at the prior power application side, an off preset value of the impedance position that is optimal for the plasma ignition is determined, there is no need to do so in the autorunning in the lower matching unit 88 where the power is applied later than the upper side and, instead, it is preferable to determine an off preset value of the impedance position such that no significant variation will be caused in the previously ignited plasma by applying the lower radio frequency power to the lower electrode 16.

From the above point of view, in the autorunning in the lower matching unit 88 of this example, $V_{PP}$ logging information is obtained in the same sequence of the autorunning in the upper matching unit 44 (steps A1 to A8), a minimum value is determined among all of the measured $V_{PP}$ values stored in the memory by using a minimum value determining process (comparison operation) (step A9), and an impedance position of the lower matching unit 88 corresponding to the minimum $V_{PP}$ value is registered as the position at a time when the upper RF application is initiated for a plasma processing, i.e., the optimal off preset position at which the ignited plasma is affected minimally (step A10).

Figure 8:
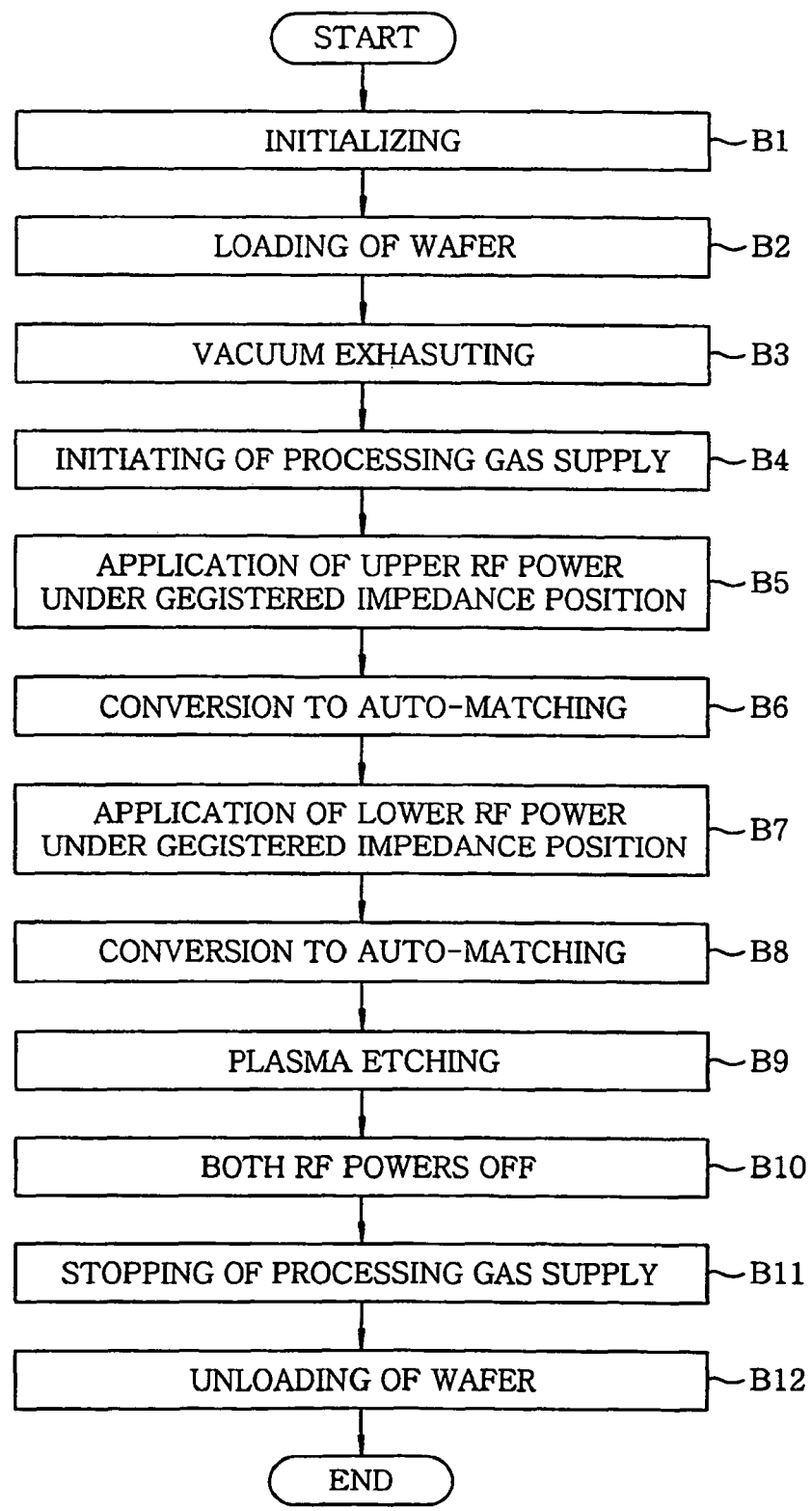
FIG. 8 offers a flow chart showing a major sequence of the plasma processing in the first example.

FIG. 8 shows a major sequence of the plasma processing (particularly, the processing sequence of the main controller 100) in this example. At an initializing step (step B1), various set values for an actual process (set values of the process recipe) are set in a register and a mechanical moving part is set at its initial position. At this time, the main controller 100 sets the upper matching unit 44 and the lower matching unit 88 to the impedance positions registered in the above aurorunning, respectively. Specifically, the off preset value of the upper matching unit 44 is set to the registered impedance position corresponding to the maximum $V_{PP}$ value, and the off preset value of the lower matching unit 88 is set to the registered impedance position corresponding to the minimum $V_{PP}$ value.

After the initialization, a semiconductor wafer W is loaded into the chamber 10 to be mounted on the susceptor 16 (step B2). Then, a DC voltage is applied from the DC power supply 22 to the electrode 20 of the electrostatic chuck 18, so that the semiconductor wafer W is held on the susceptor 16.

Subsequently, the gas exhaust unit 84 is actuated to evacuate the inside of the chamber 10 (step B3), and an etching gas from the processing gas supply source 66 is introduced into the gas introduction rooms 62, 64 at respective predetermined flow rates and a predetermined flow rate ratio. The pressure in the chamber 10 is set to be maintained at a preset level (e.g., several mTorr) (step B4).

Thereafter, under the initial state where the upper matching unit 44 is set to the registered impedance position corresponding to the maximum $V_{PP}$ value, the upper radio frequency power supply 52 is set ON to output a radio frequency of a predetermined RF power (step B5). The radio frequency power outputted from the upper radio frequency power supply 52 is applied to the upper electrode 34 through the upper matching unit 44, so that an electric field of radio frequency is generated between the upper electrode 34 and the lower electrode 16. At this time, even though no impedance matching is conducted between the upper radio frequency power supply 52 and the load, $V_{PP}$ of the upper electrode 34 (or the radio frequency electric field) becomes a maximum peak value of voltage (or maximum electric field intensity) or a value close to it which is available under the corresponding upper RF power, so that the etching gas rapidly causes electric discharge to generate a gas plasma.

Next, the main controller 100 releases the off preset value with respect to the upper matching unit 44 after a predetermined time period from the time the application of the upper RF power is initiated by using, e.g., a timer function and the upper matching unit 44 is converted to the auto-matching (step B6). At the auto-matching, the controller 104 receives a measured value of the load impedance $Z_{in}$ from the RF sensor 106, and variably feedback-controls the impedance positions of the variable capacitors $C_1$, $C_2$ through the stepper motors 108, 110 such that the measured value comes to coincide with a reference impedance for matching or a matching point $Z_{MP}$. In this way, the radio frequency of the predetermined power from the upper radio frequency power supply 52 is applied to the upper electrode 34 at the maximum transmission efficiency to generate a high density plasma. Further, in order to control the conversion from the off preset value to the auto-matching, there may be used a sensor for optically monitoring the ignition of the plasma instead of the timer function.

Next, the main controller 100 monitors, by using the timer functions as described above, a proper timing when the plasma becomes stable, and sets the lower radio frequency power supply 90 ON to output a radio frequency of a predetermined lower RF power (step B7). When the lower RF is applied, the lower matching unit 88 is set to the registered impedance position corresponding to the minimum $V_{PP}$ value as described above. Therefore, $V_{PP}$ of the lower electrode 16 corresponding to the lower radio frequency becomes a minimum peak value of voltage or a value close to it which is available under the corresponding lower RF power, so that any influence on the plasma generated or being generated can be suppressed at a minimum. Then, the off preset value is released with respect to the lower matching unit 88 after a predetermined time period from the time the application of the upper RF power is initiated by using, e.g., the timer function same as described above and the lower matching unit 88 is converted to the auto-matching (step B6). At the auto-matching of the lower matching unit 88, a controller (not shown) therein variably feedback-controls the impedance positions of the variable reactance element through stepper motors such that the measured value of the load impedance obtained by the RF sensor comes to coincide with a matching point. In this way, the radio frequency of the predetermined power from the upper radio frequency power supply 52 is applied to the lower electrode 16 at the maximum transmission efficiency to perform a plasma etching (step B9).

Further, if the plasma etching process is completed, the upper and the lower radio frequency power supply 52, 90 are both set to OFF (step B10) and the supply of the etching gas from the processing gas supply source 66 is stopped (step B10).

As described above, in this example, without changing the process conditions (pressure, RF power and the like) after the initiation of the process, by merely setting the off preset or initial value of the impedance position in each of the upper and the lower matching unit 44 and 88 to a specific value (optimal value), the plasma is to get securely ignited and maintained stable even under a low pressure, so that it is possible to perform a fine etching processing by the high density plasma.

Furthermore, the main controller 100 of the first example carries out the inputting/storing of the measured $V_{PP}$ values, the determination of the maximum value (minimum value) of the measured $V_{PP}$ values, the change of the off preset value to the registered impedance position, the release of the off preset value by the timer function and the like. However, the timer function and the release of the off preset value thereby may be carried out by the controller 104 in the matching unit 44, and this is preferable in many cases in practice. Further, the controller 104 may also perform the inputting/storing of the measured $V_{PP}$ values, the determination of the maximum value (minimum value) of the measured $V_{PP}$ values, the change of the off preset value to the registered impedance position and the like.

Second Example

Figure 9:
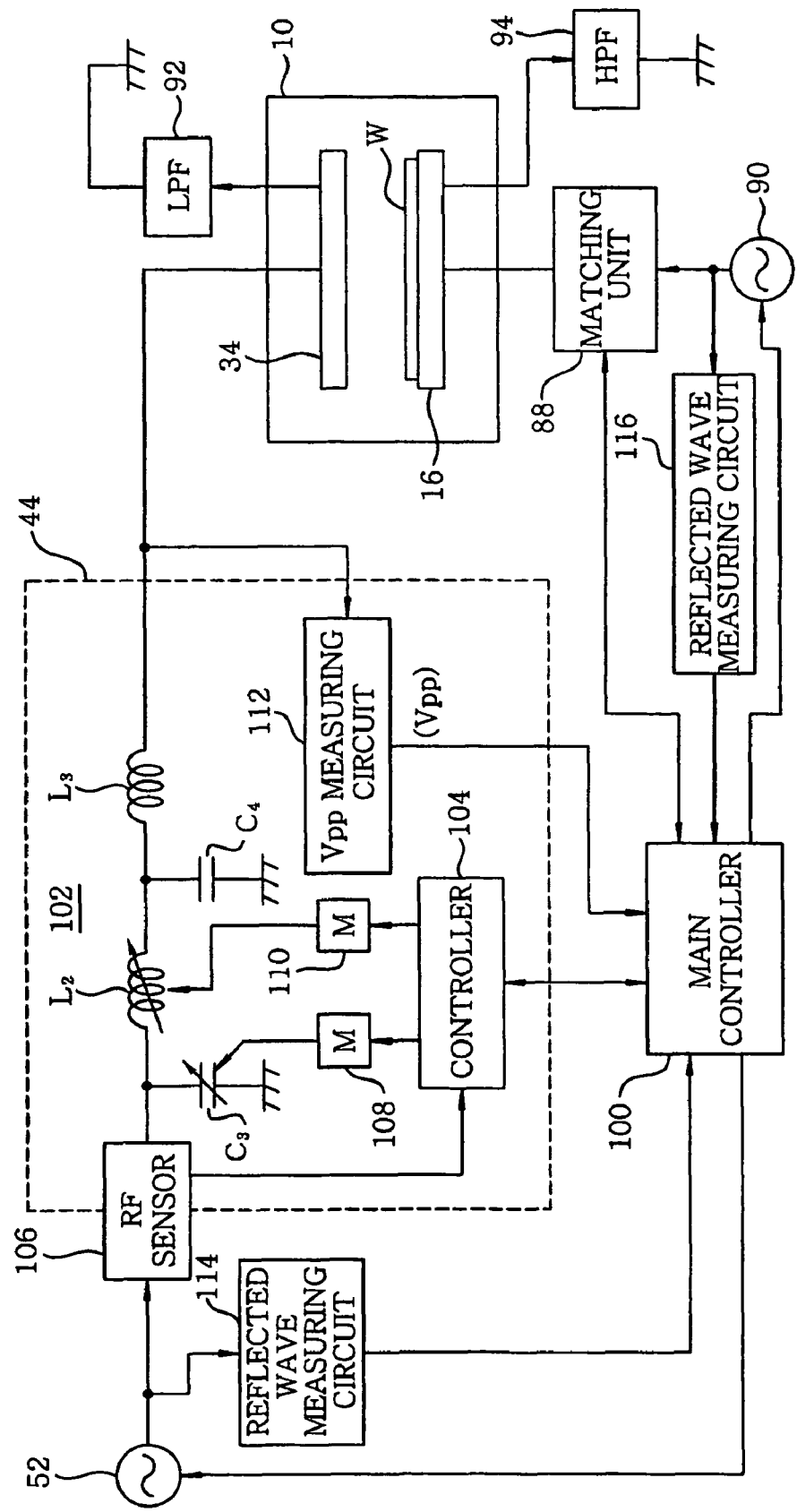
FIG. 9 illustrates a block diagram showing a configuration of a radio frequency power supply system in accordance with a second example.

FIG. 9 shows a configuration of a radio frequency power supply system in accordance with a second example. The second example is different from the first example in terms of the following two points. First, the configuration of the matching circuit 102 is changed from the T-shape to a ladder shape wherein the controller 104 serves to variably control impedance positions of a variable capacitor $C_3$ and a variable inductance coil $L_2$ through the respective stepper motors 108, 110. A capacitor $C_4$ and an inductance coil $L_4$ provided at the downstream side are a fixed capacitor and a fixed inductance coil, respectively. As such, the matching circuit 102 in the matching unit can be configured as an arbitrary variable matching circuit having one or more variable reactance elements. Another feature of this example is that there are provided to the output terminals of the radio frequency power supplies 52, 90 reflected wave measuring circuits 114, 116 for measuring powers of reflected waves by receiving the reflected waves transmitted through the transmitting lines from the matching units 44, 88, respectively.

As similarly to the first example, when the auto-matching is carried out in each of the matching units 44, 88, the controller 104 variably feedback-controls the impedance positions of the variable capacitors $C_3$ and the variable inductance coil $L_2$ through the respective stepper motors 108, 110 such that a measured value of the load impedance $Z_{in}$ obtained by the RF sensor 106 comes to coincide with a matching point $Z_{MP}$. Here, the matching point $Z_{MP}$ is typically set to a pure resistance value of 50Ω ($Z_{MP}$=50+j0) equal to the output impedance of the radio frequency power supply.

However, in case there occurs a measuring error in the RF sensor 106, even tough the measured value of the load impedance $Z_{in}$ obtained by the RF sensor 106 seemingly indicates the pure resistance value of 50Ω ($Z_{in}$=50+j0), it may not coincide with the matching point ($Z_{MP}$=50+j0) in practice. Further, in case of a large wave distortion of the radio frequency, the measuring precision of the RF sensor becomes unstable. Therefore, even when the measured value of $Z_{in}$=50+j0 is seemingly obtained, it may not coincide with the matching point ($Z_{MP}$=50+j0). In such case, the feedback control for impedance matching as described above may result in a matching of the load impedance to an impedance deviated from the matching point $Z_{MP}$, so that the RF transmission characteristic is deteriorated, which may affect the plasma process.

In this example, as will be described later, there is provided a matching point compensating function for compensating the deterioration of the measuring precision of the load impedance in the RF sensor due to the RF sensor measuring error and/or the wave distortion of the radio frequency during an actual process.

Figure 10:
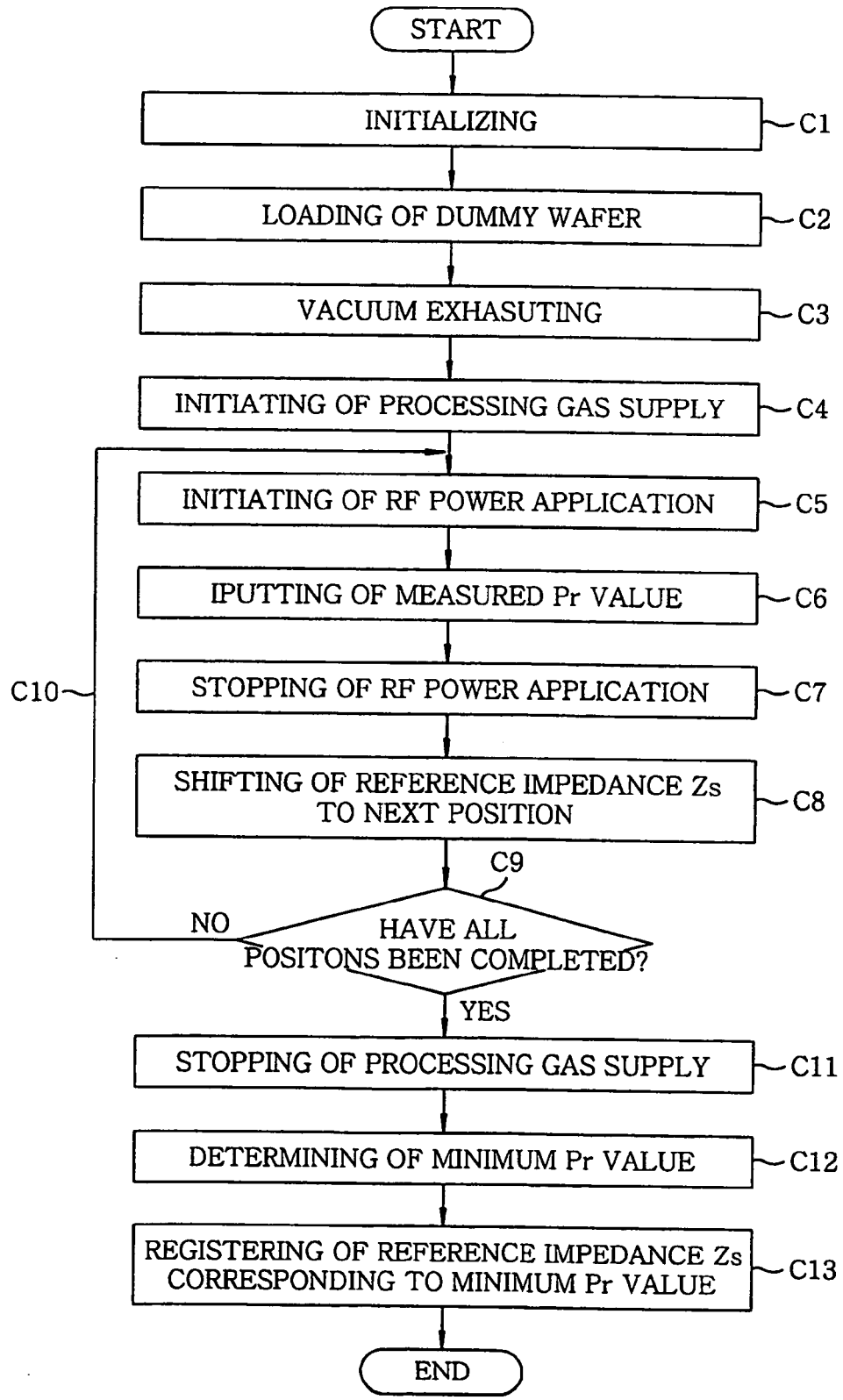
FIG. 10 describes a flow chart showing a sequence of an autorunning for compensating the matching point in the second example.

FIG. 10 shows a sequence of an autorunning (particularly, a processing sequence of the main controller 100) performed before an operation of the apparatus, for compensating the matching point in this example.

The autorunning for the matching point compensation can be performed in one direction or bidirectionally with respect to the upper matching unit 44 and the lower matching unit 88 under the substantially same conditions as those in a specific actual process.

For the convenience of explanation, the autorunning sequence in the upper matching unit 44 will be described. First, at an initializing step (step C1), the process recipe same as the specific actual process is set in a register and a mechanical moving part is set at its initial position. For the autorunning, a plurality of reference impedances $Z_S(Z_S=R+jX)$ which become target points of the load impedance $Z_{in}$ in the auto-matching in the upper matching unit 44 ($Z_{MP}=50+j0$) are in advance determined with a standard matching point of 50Ω ($Z_{MP}=50+j0$) centered, and one of them is set as an initial value.

After the initialization, a dummy semiconductor wafer W which is not an actual object to be processed is loaded into the chamber 10 to be mounted on the susceptor 16 (step C2). Then, a DC voltage is applied from the DC power supply 22 to the electrode 20 of the electrostatic chuck 18 to hold the dummy wafer W on the susceptor 16.

Subsequently, the gas exhaust unit 84 is actuated to evacuate the inside of the chamber 10 (step C3), and an etching gas (generally, a gaseous mixture) from the processing gas supply source 66 is introduced into the gas introduction rooms 62, 64 at respective predetermined flow rates and a predetermined flow rate ratio under the same conditions as those in the actual process. Under the condition that the pressure in the chamber 10 is maintained at a predetermined level by using the gas exhaust unit 84, the upper and the lower radio frequency power supply 52, 90 are set ON to output predetermined RF powers, respectively (step C5). In this case, as in the aforementioned first example, it is preferable that the upper and the lower radio frequency power supply 52 and 90 are sequentially set ON in that order.

In the upper matching unit 44, an auto-matching is carried out for the upper RF in order to make the load impedance $Z_{in}$ coincide with the reference impedance $Z_S$. Specifically, the controller 104 variably feedback-controls the impedance positions of the variable capacitors $C_3$ and/or the variable inductance coil $L_2$ through the respective stepper motors 108, 110 such that a measured value of the load impedance obtained by the RF sensor 106 becomes coincided with a reference impedance ($Z_S=R+jX$), where the reference impedance $Z_S$ is the initial value set at the previous initializing step (step C1).

The main controller 100 monitors a proper timing when the matching is accomplished by using, e.g., a timer function, and inputs and stores in the memory a measured value of a reflected wave power $P_r$ obtained at the reflected wave measuring circuit 114 (step C6). Thereafter, the upper radio frequency power supply 52 is set OFF for a moment (step C7). Then, the reference impedance $Z_S$ is shifted to a next position (step C8), and the upper radio frequency power supply 52 is again set ON to apply the RF power (steps C9→C10→C5). The auto-matching is carried out in the upper matching unit 44 and the measured value of the reflected wave power $P_r$ obtained at the reflected wave measuring circuit 114 is inputted (step C6). Subsequently, there are repeated a series of processes wherein the reference impedance $Z_S$ is sequentially shifted to preset positions and the measured value of the reflected wave power $P_r$ obtained at the reflected wave measuring circuit 114 is inputted under the shifted reference impedance $Z_S$ (steps C8→C9→C10→C5→C6 . . . ).

Figures 11, 12:
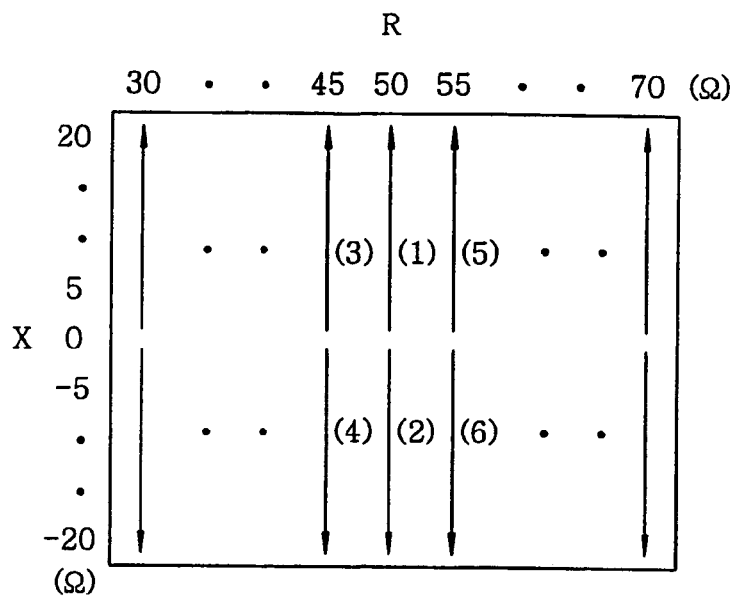
FIG. 11 provides an exemplary sequence for shifting the point (selected value) of the reference impedance step by step in the autorunning in accordance with the second example.
FIG. 12 presents a mapping of measured values obtained at the respective points of the reference impedance in the autorunning in accordance with the second example.

FIG. 11 shows an exemplary sequence for shifting the point (determined value) of the reference impedance $Z_S$ ($Z_S=R+jX$) step by step. In this example, plural points for the real real number R are determined within a range of 30Ω to 70Ω at a pitch of 5Ω with the standard of 50Ω at a center, and plural points for the imaginary number X are determined within a range of −20 to 20Ω at a pitch of 5Ω with the standard of 0Ω at a center.

In a sequence of FIG. 5A, initially, by varying the imaginary number X from 0Ω to 20Ω while the real number R is fixed at 50Ω, the upper matching unit 44 is auto-matched under the reference impedance $Z_S$ of (R+jX)=(50+j0), (50+j5), . . . (50+j20) to measure $P_r$ and record the measured value. Next, by varying the imaginary number X from 0Ω to −20Ω while the real number R is kept at 50Ω, the upper matching unit 44 is auto-matched under the reference impedance $Z_S$ of (R+jX)=(50−j0), (50−j5), . . . (50−j20) to measure $P_r$ and record the measured value. Subsequently, by shifting or changing the real number R to 45Ω and varying the imaginary number X from 0Ω to 20Ω and from 0Ω to −20Ω in the same manner as described above, the upper matching unit 44 is auto-matched under the respective reference impedances $Z_S$ to measure $P_r$ and record the measured values. Then, by shifting or changing the real number R to 55Ω and varying the imaginary number X from 0Ω to 20Ω and from 0Ω to −20Ω in the same manner as described above, the upper matching unit 44 is auto-matched under the respective reference impedances $Z_S$ to measure $P_r$ and record the measured values. The shift of reference impedances $Z_S$ and the measurement and recording (logging) of $P_r$ values are repeated in the same manner as described above.

As a result of the aforementioned logging, there are prepared in the memory of the main controller 100 all of the measured values of $P_r$ obtained by the reflected wave measuring circuit 114 as the result of the auto-matching of the upper matching unit 44 with respect to all of the reference impedances $Z_S$ determined in advance under the same conditions as those in the actual process. In practice, as shown in FIG. 12 for example, there are many cases where, depending on the reference impedances $Z_S$, the matching is not conducted, the reflection is excessively significant and the reflected wave causes a hunting to make the measuring thereof impossible. Accordingly, the logging may be limited through a trend analysis.

The main controller 100 sets the processing gas supply source 66 to OFF after the completion of the logging to stop the supply of the etching gas (step C11), determines the minimum value among all of the measured $P_r$ values stored in the memory by using a minimum value determining process (comparison operation) (step C12), and registers a reference impedance at a time when the minimum $P_r$ value is obtained as a matching point $Z_{MS}$ corresponding to the actual process (step 13). In the case of the FIG. 12, since the minimum $P_r$ value is obtained at the point of R+jX=60−j10, the matching point $Z_{MS}$ of the upper matching unit 44 for the actual process is set to $Z_{MS}$=60−j10.

The autorunning for the compensation of the matching point in the lower matching unit 88 may also be conducted in the same manner as described above between the main controller 100, the lower matching unit 88 and the reflected wave measuring circuit 116. However, the lower and the upper radio frequency power supply system differ from each other in terms of the load impedance as well as the frequency and the RF power, so that the values of the compensating matching point $Z_{MS}$ obtained as the result of the autorunning thereof are normally different from each other. Further, in the autorunning of this example, since the process conditions are changed for every process recipes, independent compensated matching points $Z_{MS}$ are obtained for every process recipes. In the auto-matching in the actual process (e.g., steps B6 and B8 in FIG. 8), compensated matching points $Z_{MS}$ corresponding to the respective process recipes are imparted to the controller 104 by the main controller 100.

According to this example, even though there occurs a measuring error of the RF sensor 106 of the upper matching unit 44 or an RF sensor (not shown) of the lower matching unit 88, or even when the wave distortion of the radio frequency during the actual process is great, the auto-matching of the matching units 44, 88 acts to make the power of the reflected wave zero or minimum, thereby improving the stability and/or the reproductivity of the process.

Further, the main controller 100 of the second example carries out the inputting/storing of the reflected wave power $P_r$, the determination of the minimum value of the measured $P_r$ values, the registration of $Z_{MS}$ and the like. However, as in the case of the first example, the controller 104 may perform the above-described functions.

FIG. 13 shows an exemplary configuration of the main controller 100. Such configured main controller 100 includes a processor (CPU) 122, a memory (RAM) 124, a program storing device (HDD) 126, a floppy drive or a disc drive (DRV) 128 for an optical disc and the like, an input device (KEY) 130 such as a key board or a mouse, a display device (DIS) 132, a network interface (COM) 134, and a peripheral interface (I/F) 136, which are connected to each other via a bus 120.

The processor (CPU) 122 reads out desired program codes from a storage medium 138 such as an FD or an optical disc inserted in the disc drive (DRV) 128, and stores them at the HDD 126. Alternatively, the desired program codes may be downloaded through a networking interface 76 from a network. Further, the processor (CPU) 122 develops the program codes required for each stage or scene onto the working memory (RAM) 124 from the HDD 126 to execute each step, and performs a desired operation process to control each part (the matching units 44, 88, the radio frequency power supply 52, 90, the processing gas supply source 66, the gas exhaust unit 84 and the like) of the apparatus through the peripheral interface 78. The program used in the autorunning described in the first and the second example and the actual process are executed on the computer system.

Although one preferred embodiment has been described above, the present invention is not limited thereto and various modifications may be made in the technical scope and spirit of the present invention. For example, in the parallel plate type, there may be employed a type of applying the radio frequency power to one electrode but not to the other electrode, or a type of simultaneously applying two kinds of radio frequency powers to one electrode. In any cases, the present invention can be applied to a variable matching unit connected between a radio frequency power supply and each electrode. Further, in the configuration of the matching unit, the RF sensor and the controller as well as the matching circuit 102 may be modified, and the $V_{PP}$ measuring circuit 112 may be installed outside the matching unit.

Although there has been described the capacitively coupled parallel plate type plasma processing apparatus wherein the radio frequency power supply is installed in the chamber in the aforementioned embodiment, the present invention may be applied to a helicon wave plasma processing apparatus or an ECR plasma processing apparatus wherein the radio frequency power supply is installed outside the chamber. The present invention is not limited to the plasma etching, but may be applied to various plasma processing such as plasma CVD, plasma oxidation, plasma nitridation, and sputtering. In the present invention, the substrate to be processed is not limited to the semiconductor wafer, but may be various substrate for FPD, a photomask, a CD substrate, a print substrate and the like.

While the invention has been shown and described with respect to the preferred embodiments, it will be understood by those skilled in the art that various changes and modification may be made without departing from the spirit and scope of the invention as defined in the following claims.

What is claimed is:

1. A plasma processing method for performing a plasma process on a substrate disposed in a plasma processing chamber by applying a radio frequency power of a frequency from a radio frequency power supply to a radio frequency electrode disposed inside or outside the chamber via a variable matching unit to generate a plasma in the chamber, the method comprising the steps of:

setting an impedance position before operating the plasma processing chamber, by:

setting an inner pressure of the chamber to a vacuum level;

applying to the radio frequency electrode the radio frequency power at a level that causes no electric discharge;

changing an impedance of the variable matching unit to a plurality of impedance positions determined within a variable range;

measuring a peak value of a radio frequency voltage in a waveguide line from an output terminal of the variable matching unit to the radio frequency electrode under each of the respective impedance positions and recording the measured peak value; and registering an impedance position having a maximum measured peak value among the plurality of impedance positions, and thereafter, plasma processing by:

setting the impedance of the variable matching unit to the registered impedance position;

loading the substrate into the chamber;

evacuating the inside of the chamber;

supplying a processing gas into the chamber; initiating application of the radio frequency power to the radio frequency electrode under the registered impedance position to ignite the plasma in the chamber; and variably controlling the impedance of the variable matching unit such that a load impedance is matched to an output impedance of the radio frequency power supply after the plasma is ignited in the chamber.

2. The plasma processing method of claim 1, wherein the radio frequency electrode and an additional radio frequency electrode are disposed in parallel with a gap there between in the chamber, an additional radio frequency power of an additional frequency is applied from an additional radio frequency power supply to the additional radio frequency electrode via an additional variable matching unit.

3. The plasma processing method of claim 2, wherein an application of the additional radio frequency power to the additional radio frequency electrode is initiated after the plasma is ignited in the chamber.

4. The plasma processing method of claim 3, wherein the plasma process performing step further includes the steps of:

initiating the application of the additional radio frequency power under an additional impedance where a peak value of an additional radio frequency voltage obtained at the additional radio frequency electrode becomes a minimum value among variable impedances of the additional variable matching unit; and variably controlling an impedance of the additional variable matching unit such that a load impedance is matched to an output impedance of the additional radio frequency power supply after a predetermined time period from the time the application of the additional radio frequency power is initiated.

5. A plasma processing method comprising:

a first step of disposing a dummy substrate at a specified position in a depressurizable chamber, depressurizing the inside of the chamber to a predetermined vacuum level under the substantially same conditions as a desired process recipe, supplying a processing gas into the chamber, applying a radio frequency power of a predetermined frequency at a level from the radio frequency power supply to a radio frequency electrode via a variable matching unit to generate a plasma in the chamber, and variably controlling the impedance of the variable matching unit such that a measured value of a load impedance is matched to each of a plurality of reference impedances determined in advance;

a second step of measuring a power of a reflected wave obtained at the side of the radio frequency power supply under each of the respective reference impedances and recording the measured power of reflected wave;

a third step of registering a reference impedance selected from among the reference impedances, the selected reference impedance being a reference impedance under which a minimum measured power of reflected wave is obtained;

a fourth step of unloading the dummy substrate from the chamber; and a fifth step of disposing a substrate to be processed at the specified position in the chamber, depressurizing the inside the chamber to the predetermined vacuum level under the conditions of the process recipe, supplying a processing gas into the chamber, applying a predetermined magnitude of the radio frequency power from the radio frequency power supply to the radio frequency electrode via the variable matching unit to generate a plasma in the chamber, and variably controlling the impedance of the variable matching unit such that the measured value of the load impedance is matched to the registered reference impedance, thereby performing a plasma process on the substrate.

6. The plasma processing method of claim 5, wherein at the first step, whenever matching the measured value of the load impedance to each of the reference impedances, the radio frequency power is again applied from the radio frequency power supply to the radio frequency electrode to generate the plasma.

7. The plasma processing method of claim 4, wherein the impedance position setting step further includes the steps of:

setting the inner pressure of the chamber to a vacuum level;

applying to the additional radio frequency electrode the additional radio frequency power at a level that causes no electric discharge, changing the impedance of the additional variable matching unit to a plurality of additional impedance positions determined within a variable range step by step;

measuring an additional peak value of a radio frequency voltage on a waveguide line from an output terminal of the additional variable matching unit to the additional radio frequency electrode under each of the respective additional impedance positions and recording the measured additional peak value; and registering an impedance position having a minimum measured additional peak value among the plurality of additional impedance positions as an impedance position corresponding to the additional impedance.

* * * * *